United States Patent
Lin et al.

(10) Patent No.: US 7,101,210 B2
(45) Date of Patent: Sep. 5, 2006

(54) LGA SOCKET

(75) Inventors: Nick Lin, Tu-Chun (TW); Jian Zhang, Shenzhen (CN); Yu-Chen Chen, Tu-Chun (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/288,730

(22) Filed: Nov. 28, 2005

(65) Prior Publication Data

US 2006/0116012 A1 Jun. 1, 2006

(30) Foreign Application Priority Data

Nov. 26, 2004 (TW) .............................. 93219040 U

(51) Int. Cl.
*H01R 13/62* (2006.01)

(52) U.S. Cl. ......................................... 439/331; 439/73

(58) Field of Classification Search ................ 439/131, 439/73, 330, 680, 70
See application file for complete search history.

(56) References Cited

U.S. PATENT DOCUMENTS

| | | | | |
|---|---|---|---|---|
| 3,458,794 A | * | 7/1969 | Bohnstedt et al. | 320/111 |
| 4,433,886 A | * | 2/1984 | Cassarly et al. | 439/65 |
| 4,697,070 A | * | 9/1987 | Kai | 219/521 |
| 5,023,396 A | * | 6/1991 | Bartee et al. | 174/48 |
| 5,082,450 A | * | 1/1992 | Warren et al. | 439/102 |
| 5,135,406 A | * | 8/1992 | Ishikawa | 439/131 |
| 5,302,853 A | * | 4/1994 | Volz et al. | 257/707 |
| 5,401,178 A | * | 3/1995 | Liu | 439/131 |
| 5,485,351 A | * | 1/1996 | Hopfer et al. | 361/704 |
| 5,628,641 A | * | 5/1997 | Hahn | 439/131 |
| 6,275,002 B1 | * | 8/2001 | Chen | 320/111 |
| 6,413,111 B1 | * | 7/2002 | Pickles et al. | 439/342 |
| 6,478,588 B1 | * | 11/2002 | Howell et al. | 439/135 |
| 6,533,592 B1 | * | 3/2003 | Chen et al. | 439/135 |
| 6,632,098 B1 | * | 10/2003 | Wong et al. | 439/131 |
| 6,743,039 B1 | * | 6/2004 | Shirai et al. | 439/342 |
| 2003/0143884 A1 | * | 7/2003 | Kung et al. | 439/342 |
| 2004/0032720 A1 | * | 2/2004 | McHugh et al. | 361/719 |
| 2004/0259407 A1 | * | 12/2004 | Chiang | 439/331 |
| 2004/0266245 A1 | * | 12/2004 | Liao | 439/331 |
| 2005/0032408 A1 | * | 2/2005 | Liao et al. | 439/331 |
| 2005/0233628 A1 | * | 10/2005 | Yang et al. | 439/331 |

\* cited by examiner

*Primary Examiner*—Tulsidas C. Patel
*Assistant Examiner*—Vladimir Imas
(74) *Attorney, Agent, or Firm*—Wei Te Chung

(57) ABSTRACT

Disclosed is a LGA socket connector including an insulative housing (2), a stiffener (3), a clip (4), and a lever (5) defining thereof a driving portion (50) and a locking portion (52) linked thereto. The stiffener is configured to grasp a periphery of the housing. The clip and the locking portion of the lever are essentially pivotally moved about longitudinal ends of the housing respectively, but with the driving portion disposed adjacent one transverse side of the housing. At least one of the clip and the stiffener is provided with a recessed region (300) adjacent said transverse side of the housing, thereby preventing the whole connector from becoming inclined when the connector is horizontally locked and placed on the printed circuit board.

16 Claims, 4 Drawing Sheets

LGA SOCKET

BACKGROUND OF THE INVENTION

1. Field of the Invention

The present invention relates to an electrical connector, especially to an LGA socket connector for connecting a CPU chip and a printed circuit board.

2. Background of the Invention

Various types of conventional electrical connectors are known for electrically connecting an IC package, such as a CPU, with a circuit board, such as a printed circuit board (PCB).

One of the widely-known electrical connectors is a land grid array (LGA) socket connector, particularly utilized for electrically connecting the CPU with the PCB. Typically, the LGA socket connector includes an insulative housing with a plurality of terminals assembled therein, a stiffener generally defining an opening to grasp a periphery of the housing, a clip and a lever respectively disposed adjacent two ends of the housing to jointly press the CPU chip onto the housing so as to make electrically connection between the CPU chip and the LGA socket.

In general, the housing, the stiffener, the clip each have a symmetrical configuration except for the lever. More specifically, the level, generally formed of a heavy metal, is composed of a locking portion and a driving portion linked to the locking portion. When the LGA socket is in a horizontally locked position, the driving portion is positioned beside one side of the clip, while the locking portion of the lever is disposed adjacent one end of the housing and in opposed relationship with the clip. As such, a center of gravity of the connector tends to be at a position biased towards the driving portion of the lever, thereby causing positional misalignment between a geometry center of the connector and the center of gravity of the connector.

When the LGA socket is horizontally locked and placed on the printed circuit board, the LGA socket becomes inclined with respect to the circuit board due to such positional misalignment between the geometry center and the gravity center of the connector. Coplanarity of the solder balls on the connector along a mounting interface is thus influenced by potential variations in sizes of respective solder balls, when the inclined connector is attached to the printed circuit board by solder balls melt at a high temperature. This will often result in electrical connection failure at a certain area between the inclined connector and the printed circuit board.

In view of the above, it is strongly desired to provide a new LGA socket connector, which overcomes the above-mentioned disadvantages.

SUMMARY OF THE INVENTION

An LGA socket connector in accordance with embodiment of the present invention is provided with a recessed region in the connector to prevent a center of gravity of the whole connector biased from a geometry center of the connector, thereby avoiding the connector becomes inclined with respect to the printed circuit board when the connector is locked and placed on the printed circuit board.

In preferred embodiments of the present invention, the LGA socket connector for electrical connection to a printed circuit board includes a rectangular insulative housing, a rectangular frame-like stiffener, a clip and a lever. The housing defines thereof a longitudinal direction and a transverse direction perpendicular to each other, and includes a main portion and a periphery portion surrounding the main portion. The stiffener defines an opening to grasp the periphery portion of the housing. The clip essentially pivotally moved about a first longitudinal end of the housing, and defines a locking hook adjacent to a second longitudinal end of the housing opposite to opposite to the first longitudinal end when said clip is in a horizontal locked position. The lever defines thereof a locking portion essentially pivotally moved about the second longitudinal end of the housing so as to lock said clip in the horizontal locked position, and a driving portion linked to the locking portion for driving the locking portion to make such a pivotal movement. The driving portion is further disposed adjacent a first transverse side of the housing whereby the whole connector has the center of gravity biased from the geometry center of the connector when the connector is horizontally locked by the lever and clip. At least one of the stiffener and the housing is provided with a plurality of recesses adjacent the first transverse side of the housing to prevent the whole connector from becoming inclined with respect to the printed circuit board when the connector is locked and placed on the printed circuit board.

One of advantages of embodiments of the present invention is that the electrical connector is no longer inclined with respect to the circuit board when the connector is attached to the printed circuit board by solder balls melt at a high temperature. Therefore, possibility of electrical connection failure between the connector and the circuit board is avoided.

Other features and advantages of embodiments of the present invention will become more apparent to those skilled in the art upon examination of the following drawing and detailed description of preferred embodiments, in which:

DETAILED DESCRIPTION OF THE PREFERRED EMBODIMENTS

Figure 1:
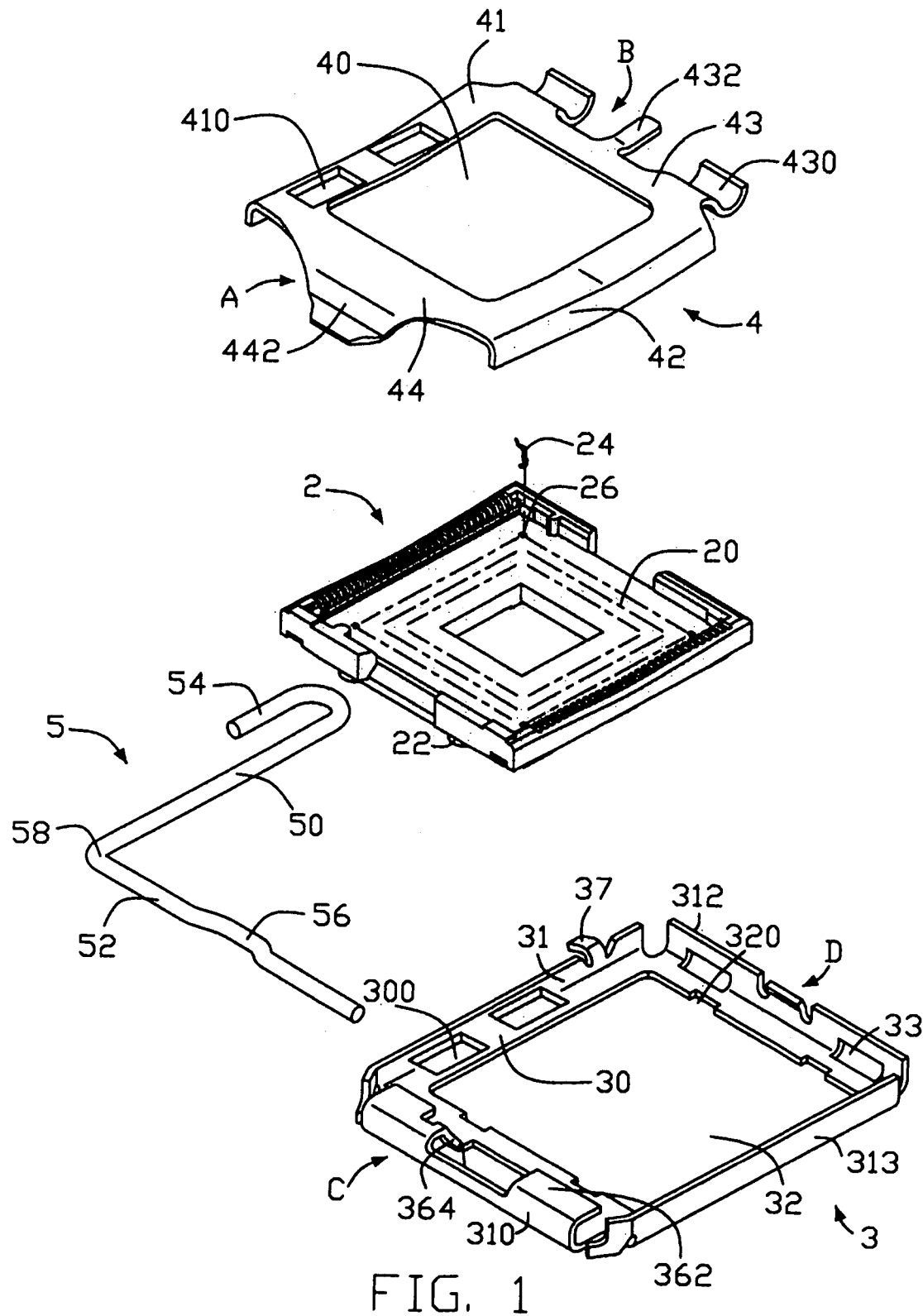
FIG. 1 is an exploded isometric view of an electrical connector in accordance with a preferred embodiment of the present invention.

Reference will now be made to the drawings to describe preferred embodiments of the present invention in detail.

Referring to FIGS. 1 to 4, an LGA socket according to the preferred embodiment of the invention is shown with an IC package 7 received therein. The LGA socket includes a rectangular insulative housing 2, a plurality of terminals 24 received in the housing 2, a rectangular frame-like stiffener 3, a clip or cover member 4, a driving member 5. The driving member 5 formed of a lever defines thereof a driving portion 50 and a locking portion 52 linked thereto. The stiffener 3 is configured to grasp a periphery of the housing 2. The clip 4 and the locking portion 52 of the lever 5 are essentially pivotally moved about longitudinal ends of the housing 2 respectively, but with the driving portion 50 disposed adjacent one transverse side of the housing 2. In the preferred embodiment, at least one of the clip 4 and the stiffener 3 is provided with a recessed region 300 or 410 adjacent said transverse side of the housing 2, thereby preventing the whole connector from becoming inclined with respect to a printed circuit board (not shown) when the connector is locked and placed on the printed circuit board. It should be noted that, in some embodiments, the insulative housing 2, the stiffener 3 and/or the cover member 4 may be regarded as a part of a socket body.

The insulative housing 2 has a rectangular frame body, generally molded from resin or the like. An IC package receiving region 20 is defined in the central of the insulative housing 2 and has a horizontal top surface (not labeled) defined for receiving an IC package. The IC package receiving region 20 includes a plurality of cavities 26 under the top surface thereof. The plurality of cavities 26 is arranged in rows and columns, for receiving the respective terminals 24 therein. On the bottom surface of the insulative housing 2, projecting portions 22 are formed to engage with respective notches 320 of the reinforcing plate 3.

Each of the terminals 24 has an upper portion (not labeled) extending from the top surface, for electrically connecting with a corresponding pad of the IC package 7, and a lower portion (not labeled) having a solder ball soldered thereon, for attachment to a circuit board. Thus, through the connector, electrical connection between the IC package 7 and the circuit board is established.

The driving member 5 is generally of a lever shape (hereinafter referred to as "a lever"), formed by bending a single metallic wire for several times. The lever 5 includes a driving portion 50, a locking portion 52 substantially perpendicular to the driving portion 50, and a connecting portion 58 in connection with the driving portion 50 and the locking portion 52. The driving portion 50 is bent at a right angle with respect to the locking portion 52. At a tip of the driving portion 50 is formed a U-shaped portion 54, for ease of actuation by a finger. A locking shaft 56, for locking the cover member 4 against the stiffener 3, is formed on the median of the locking portion 52, with spaced rotary shafts (not labeled) at opposite ends of the locking portion 52.

Specifically, the cover member or clip 4 is pivotally mounted on the first end of the insulative housing 2, and is formed of a rectangular shape by stamping and bending a single sheet of metal. The cover member 4 has the front part A located adjacent the first end of the insulative housing 2, an rear part B opposite to the front part A and located adjacent the second end of the insulative housing 2, and a rectangular opening 40 defined midway between the front part A and the rear part B. The cover member 4 has a pair of spaced bearing tongues 430 projecting from the rear part B and being curved upwards, for engaging with a mounting slots 33 of the reinforcing plate 3. A holding element 432 is formed in the middle portion between the pair of bearing tongues 430. The rectangular opening 40, into which the IC package 7 is positioned, is formed at a central of the cover member 4. An interlocking element 442 projects downwards from a middle portion of the front part A and extends horizontally in outward direction, for engaging with the locking shaft 56 of the lever 5.

Opposite edges or sides 41, 42 of the cover member 4, between the front part A and the rear part B, are bent downward to form curved surfaces, for engaging with upward-curved surfaces of the reinforcing plate 3. The cover member has a first edge or side 41, corresponding to the driving portion 50 of the lever 5, and a second edge or side 42 opposite to the first edge 41. A first recessed region 410 is defined in a suitable position along the first edge 41 of the cover member 4, for adjusting the originally-biased center of gravity of the connector to a predetermined position that is identical to the geometry center 96 of the insulative housing 2. The first recessed region 410 is provided with a few rectangular recesses or recess-like portions in a predetermined array, or a single rectangular recess if that recess is big enough for weight compensation/balance to adjust the biased center of gravity of the connector. It is appreciated that the first recessed region 410 can have other recess-like shapes and/or configurations, depending on what the amount of weight compensation is required for the connector. First elongated protrusions 420 may be formed on an inner surface of the second edge 42 opposite to the first edge 41, for assisting in adjustment of the biased center of gravity of the connector. The protrusions 420 are shaped and sized to engage with the corresponding edge (not labeled) of the insulative housing 2, thereby avoiding fit interference to the edge of the insulative housing 2. Grooves (not shown) may also be formed in the edge of the insulative housing 2, to further engage with the protrusions 420 of the cover member 4.

The stiffener 3 is formed by stamping and bending a single sheet of metal into a rectangular plate with a large rectangular opening 32 formed at a center thereof. The stiffener 3 is provided on the bottom surface of the insulative housing 2 so as to extend between the first end and the second end of the insulative housing 2. Notches 320 are provided at front and rear edges of the opening 32, for engaging with the respective projecting portions 22 of the insulative housing 2, so the relative positional relationship between the stiffener 3 and the insulative housing 2 is established. The reinforcing plate 2 has a front part C located adjacent the first end of the insulative housing 2 and a rear part D opposite to the front part C located adjacent the second end of the insulative housing 2. Side edges of the stiffener 3 are bent upward to form a front wall 310, a rear wall 312 and sidewalls 311, 313.

The front wall 310 has a pair of spaced L-shaped retaining elements 362 projecting upward and bent inward, for corresponding to the rotary shafts of the lever 5, respectively. An interlocking tab 364 is formed at an end side of the retaining elements 362 and adjacent the intersecting portion between the rotary shaft and the locking shaft 56 so as to support the locking shaft 56 of the lever. The retaining elements 362 and interlocking element 364 cooperatively serves to support the lever 5 against the stiffener 3, when the electrical connect is in an open position.

Figure 3:
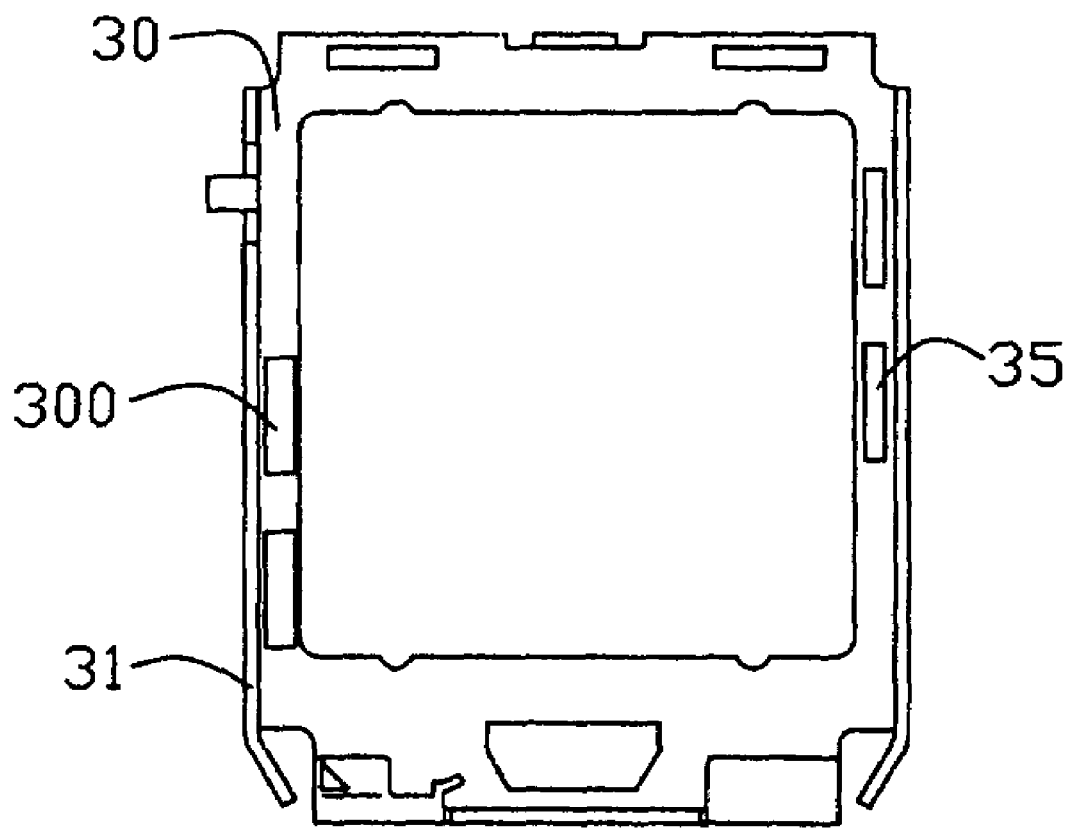
FIG. 3 is a top view of a reinforcing plate of FIG. 1.

The sidewalls 311, 313 extend in a front-rear direction of the reinforcing plate 3. An interlocking protrusion 37, for engaging with the lever 5, projects upward from an upper edge of the sidewall 311 and extends laterally toward an exterior of the stiffener 3 in a direction substantially perpendicular to the side wall 311. The first sidewall 311 has a second recessed region 300, for corresponding to the first recessed region 410. The second recessed region 300 preferably has rectangular recesses or recess-like portions and/or configuration, similar to that of the first recessed region 410, for further adjusting the biased center of gravity of the connector. It is appreciated that the second recessed region 300 can have any other recesses or recess-like shapes and/or configuration different from that of the first recessed region 410, depending on various specific conditions under which the electrical connector is used. As shown in FIG. 3, second elongated protrusions 35 are formed in the second sidewall 313 to extend along a side edge thereof, for assisting in adjustment of the biased center of gravity of the housing, if necessary.

The rear wall 312 extends upward and has a pair of spaced mounting slots 33, for engaging with the bearing tongues 430 of the cover member 4. When the cover member 4 is attached to the reinforcing plate 3, the pair of bearing tongues 430 is pressed into the mounting slots 33, respectively.

Figure 2:
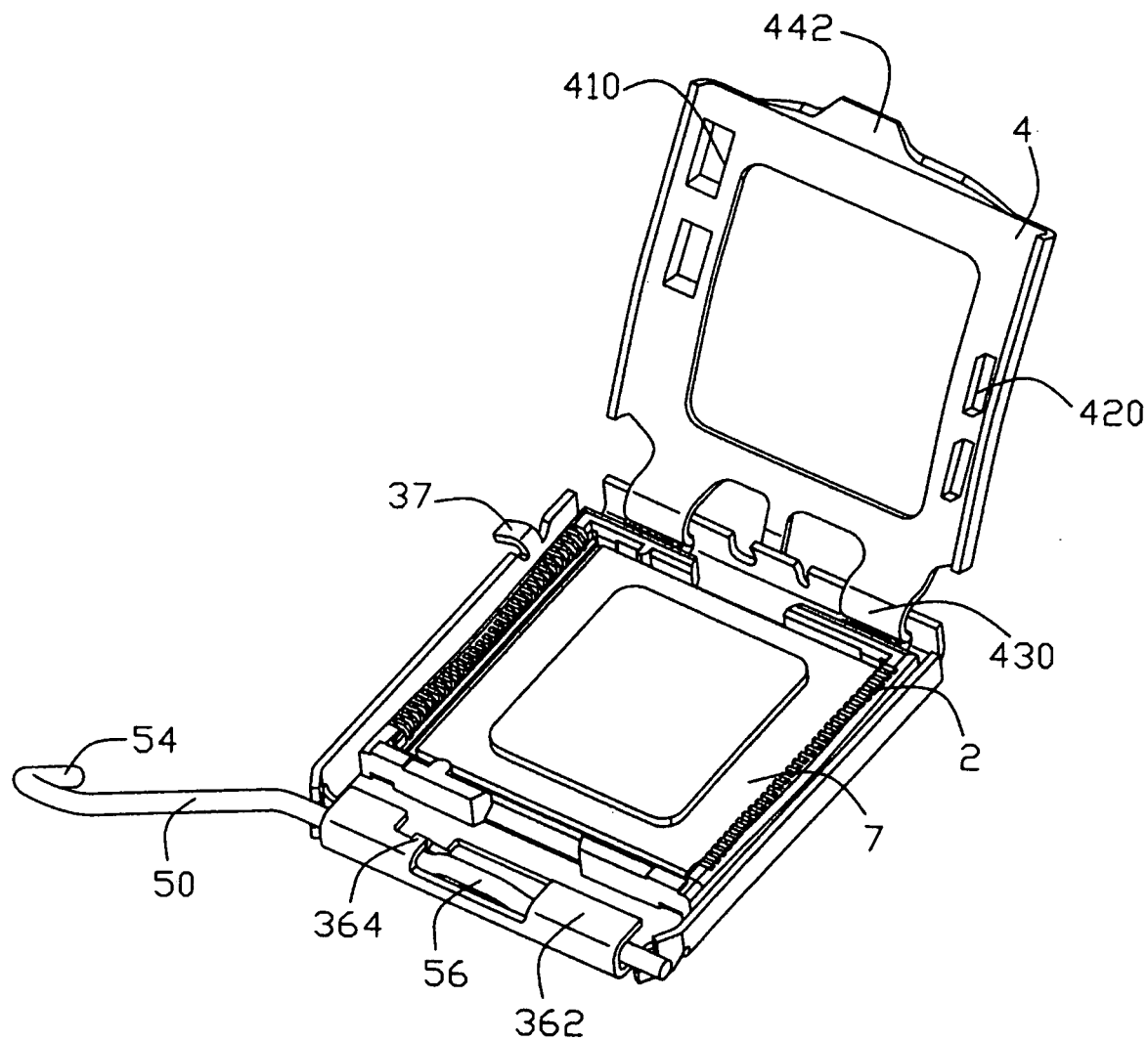
FIG. 2 is an assembled view of the electrical connector of FIG. 1, but showing the electrical connector in an opened position with an IC package received therein.

Referring to FIG. 1 and FIG. 2, in assembly, the bearing tongues 430 of the cover member are inserted into the mounting slots 33 of the reinforcing plate 3, respectively. The holding element 432 is held against the surface of the rear wall 312 of the stiffener 3 and suppresses the movement of the cover member 4 towards a direction in which the cover member 4 falls out from the mounting slots 33. The lever 5 is pivotally supported by the retaining elements 362 and interlocking element 364 of the reinforcing plate 3. When the cover member 4 is positioned in an open position, the insulative housing 2 is loaded and secured in the stiffener 3 by projecting portions 22 that engage with respective notches 320 of the reinforcing plate 3. Thus, the stiffener 3 is positioned so as to extend between the first end and the second end of the insulative housing 2.

Figure 4:
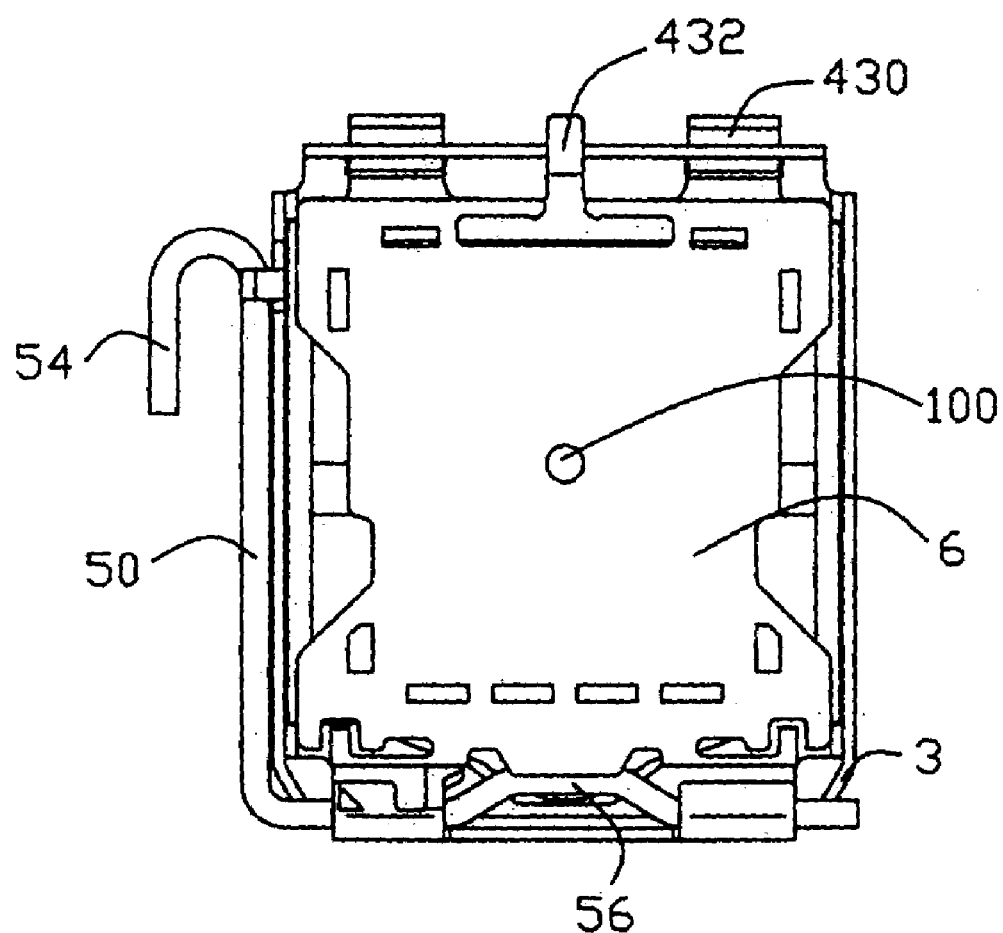
FIG. 4 is a top view of the electrical connector of FIG. 2, but showing the electrical connector is in an closed position.

In use, a pick-up cap 6 (shown in FIG. 4) is engaged with peripheral edges of the opening 40 of the cover member 4. The pick-up cap 6 is suctioned by a suction nozzle of an apparatus (not shown), until the connector is removed and soldered onto the circuit board. As shown in FIG. 2, the driving portion 50 of the lever 5 is raised so that the locking shaft 56 of the lever 5 is disengaged from the interlocking portion 442 of the cover member 4, and the cover member 4 is positioned in the open position. The IC package 7 is placed on top of the insulative housing 2. As shown in FIG. 4, the cover member 4 is pivoted to a closed position, the driving portion 50 of the lever 5 is lowered to enable the locking shaft 56 to press downwards on the cover member 4. When the cover member 4 is closed, a peripheral edge of the opening 40 of the cover member press on the upper surface of the IC package 7, so that pads (not shown) of the IC package 7 electrically connect with the respective contacts received in the insulative housing 2. Because of the recessed region 300, 410 located adjacent the driving portion 50 of the lever 5, and the protrusions 35, 420 positioned opposite the driving portion 50, weight compensation/balance throughout the connector is achieved, and originally-biased center of gravity of the connector is re-adjusted to its geometric center 100 of the connector. In other words, the center of gravity of the connector is substantially in alignment with the center of geometry of the connector. The connector is no longer inclined with respect to the circuit board when solder balls on the connector are melted and soldered onto the circuit broad. Therefore, possibility of electrical connection failure between the connector and the circuit board is avoided.

Furthermore, in other embodiments, the width of the second edge 42 of the cover member 4 may be greater than that of the first edge 41 of the cover member 4, in such a situation where the readjusted center of gravity of the connector is slightly misalignment with the center of geometry of the connector. Alternatively, the stiffener 3 is designed to have the second edge 313 heavier or wider than the first edge 311, to do such an adjustment.

While the present invention has been described with reference to specific embodiments, the description of the embodiments is illustrative, but not to be construed as limiting the invention. Various of modifications to the present invention can be made to the preferred embodiments by those skilled in the art without departing from the true spirit and scope of the invention as defined by the appended claims.

What is claimed is:

1. An LGA (Land Grid Array) connector for electrical connection to a printed circuit board, the LGA connector comprising:
    a rectangular insulative housing defining thereof a longitudinal direction and a transverse direction perpendicular to each other, and including a main portion and a periphery portion surrounding the main portion;
    a rectangular frame-like stiffener defining an opening to grasp said periphery portion;
    a clip essentially pivotally moved about a first longitudinal end of the housing and defining a locking hook adjacent to a second longitudinal end of the housing opposite to the first longitudinal end when said clip is in a horizontal locked position; and
    a lever defining thereof a locking portion essentially pivotally moved about the second longitudinal end of the housing so as to lock said clip in the horizontal locked position, and a driving portion linked to the locking portion for driving the locking portion to make such a pivotal movement, the driving portion further disposed adjacent a first transverse side of the housing whereby the whole connector has a center of gravity biased from a geometry center of the connector when the connector is horizontally locked by the lever and clip;
    wherein at least one of said stiffener and said housing defining a recessed region located adjacent the first transverse side of the housing to prevent the whole connector from becoming inclined with respect to the printed circuit board when the connector is locked and placed on the printed circuit board.

2. The LGA connector as recited in claim 1, wherein the recessed region is defined along a first transverse side of the stiffener adjacent the driving portion of the lever when the connector is horizontally locked.

3. The LGA connector as recited in claim 2, wherein the stiffener further includes a plurality of protrusions defined along a second transverse side of the stiffener opposite to the first transverse side of the stiffener.

4. The LGA connector as recited in claim 2, wherein the stiffener includes a second transverse side wider or heavier than the first transverse side thereof, the second transverse side being opposite to the first transverse side of the stiffener.

5. The LGA connector as recited in claim 1, wherein the recessed region is defined along a first transverse side of the clip adjacent the driving portion of the lever when the connector is horizontally locked.

6. The LGA connector as recited in claim 2, wherein the clip further includes a plurality of protrusions defined along a second transverse side of the clip opposite to the first transverse side of the clip.

7. The LGA connector as recited in claim 2, wherein the clip includes a second transverse side wider or heavier than the first transverse side thereof, the second transverse side being opposite to the first transverse side of the clip.

8. An LGA socket for electrically connecting with a CPU chip and a printed circuit board, the LGA socket comprising:
    a socket body defining thereof a longitudinal direction and a transverse direction perpendicular to each other; a reinforcing member disposed around at least a part of the socket body;
    a cover member and a lever respectively disposed adjacent two longitudinal ends of the socket body to jointly press the CPU chip onto the socket body;
    the socket body, the reinforcing member, the cover member and the lever having a center of gravity of the connector biased from a geometry center of the socket body and towards a first transverse side of the socket body; and at least one of the reinforcing member and the cover member defining thereof a recessed region adjacent the first transverse side of the socket body such that the center of gravity of the connector is substantially aligned with the geometry center of the socket body.

9. The LGA socket as recited in claim 8, wherein the lever includes a driving portion and a locking portion linked thereto, the locking portion being located adjacent the first transverse side of the socket body.

10. The LGA socket as recited in claim 9, wherein the recessed region is defined along a first transverse side of the stiffener adjacent the driving portion of the lever when the connector is horizontally locked.

11. The LGA socket as recited in claim 10, wherein the stiffener further includes a plurality of protrusions defined along a second transverse side of the stiffener opposite to the first transverse side of the stiffener.

12. The LGA socket as recited in claim 10, wherein the stiffener includes a second transverse side wider or heavier than the first transverse side thereof, the second transverse side being opposite to the first transverse side of the stiffener.

13. The LGA socket as recited in claim 9, wherein the recessed region is defined along a first transverse side of the clip adjacent the driving portion of the lever when the connector is horizontally locked.

14. The LGA socket as recited in claim 13, wherein the clip further includes a plurality of protrusions defined along a second transverse side of the clip opposite to the first transverse side of the clip.

15. The LGA socket as recited in claim 13, wherein the clip includes a second transverse side wider or heavier than the first transverse side thereof, the second transverse side being opposite to the first transverse side of the clip.

16. An LGA socket for electrically connecting with a CPU chip and a printed circuit board, the LGA socket comprising:

a socket body defining thereof a longitudinal direction and a transverse direction perpendicular to each other;

a reinforcing member surrounding the socket body;

a cover member and a lever respectively disposed adjacent two longitudinal ends of the socket body to jointly press the CPU chip onto the socket body;

the socket body, the reinforcing member, the cover member and the lever having a center of gravity of the connector biased from a geometry center of the socket body and towards a first transverse side of the socket body; and at least one of the reinforcing member and the cover member defining thereof a recessed region adjacent the first transverse side of the socket body such that the center of gravity of the connector is substantially aligned with the geometry center of the socket body.

* * * * *